United States Patent
Kim

(10) Patent No.: US 10,936,111 B2
(45) Date of Patent: Mar. 2, 2021

(54) DISPLAY DEVICE

(71) Applicant: Samsung Display Co., Ltd., Yongin-si (KR)

(72) Inventor: Hak Gyu Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 70 days.

(21) Appl. No.: 16/137,565

(22) Filed: Sep. 21, 2018

(65) Prior Publication Data

US 2019/0235691 A1    Aug. 1, 2019

(30) Foreign Application Priority Data

Jan. 30, 2018 (KR) .................. 10-2018-0011267

(51) Int. Cl.
*G06F 3/041* (2006.01)
*H05K 1/02* (2006.01)
*H05K 1/14* (2006.01)

(52) U.S. Cl.
CPC .......... *G06F 3/0416* (2013.01); *H05K 1/028* (2013.01); *H05K 1/147* (2013.01); *G06F 2203/04103* (2013.01); *H05K 2201/041* (2013.01); *H05K 2201/056* (2013.01)

(58) Field of Classification Search
CPC ........ G06F 3/0416; G06F 2203/04103; H05K 1/147; H05K 1/028; H05K 2201/056; H05K 2201/041
See application file for complete search history.

(56) References Cited

U.S. PATENT DOCUMENTS

| | | |
|---|---|---|
| 8,111,248 B2 | 2/2012 | Lee et al. |
| 9,129,916 B2 | 9/2015 | Kim |
| 9,287,334 B2 | 5/2016 | Jung et al. |
| 2014/0085281 A1* | 3/2014 | Lim ............... G09G 3/3266 345/206 |
| 2015/0162388 A1* | 6/2015 | Kim ............... H01L 27/323 257/40 |
| 2016/0026315 A1* | 1/2016 | Choi ............... G06F 3/0414 345/174 |

FOREIGN PATENT DOCUMENTS

| | | |
|---|---|---|
| KR | 10-1002308 | 3/2010 |
| KR | 10-2014-0080677 | 7/2014 |
| KR | 10-2015-0068067 | 6/2015 |
| KR | 10-2016-0013484 | 2/2016 |

* cited by examiner

*Primary Examiner* — Alexander Eisen
*Assistant Examiner* — Kebede T Teshome
(74) *Attorney, Agent, or Firm* — H.C. Park & Associates, PLC

(57) ABSTRACT

A display device including a display panel configured to display an image and sense a touch, a first flexible printed circuit film bonded to one edge of the display panel, a second flexible printed circuit film bonded to another edge of the display panel, and a printed circuit board to which the first flexible printed circuit film and the second flexible printed circuit film are bonded or connected, in which the second flexible printed circuit film includes a main portion and a tail portion extending from the main portion, and the tail portion includes a first portion extending from the main portion in a first direction and a second portion extending from the first portion in a second direction different from the first direction.

16 Claims, 12 Drawing Sheets

DISPLAY DEVICE

CROSS-REFERENCE TO RELATED APPLICATION

This application claims priority from and the benefit of Korean Patent Application No. 10-2018-0011267, filed on Jan. 30, 2018, which is hereby incorporated by reference for all purposes as if fully set forth herein.

BACKGROUND

Field

Exemplary embodiments of the invention relate generally to a display device, and, more specifically, to a display device having a structure that provides an efficient testing.

Discussion of the Background

A display device, such as an organic light emitting diode display and a liquid crystal display, includes a display panel having a screen for displaying an image. The display panel may have a touch sensing function to provide a user interaction platform, in addition to an image displaying function.

A display device may include a flexible printed circuit film for transmitting a signal to display an image on the display panel (hereinafter referred to as "a flexible printed circuit film for display"), and a flexible printed circuit film for transmitting a signal for sensing a touch (hereinafter referred to as "a flexible printed circuit film for touch"). One end of each of the flexible printed circuit films may be bonded to the display panel, and the other end thereof may be bonded to or connected to a printed circuit board (PCB). The flexible printed circuit films may receive various signals through the printed circuit board (PCB).

After the flexible printed circuit films are bonded, most parts thereof may be bent to be positioned on a rear surface of the display panel together with the printed circuit board. In this case, it may be difficult to bend the flexible printed circuit film for touch, as it is connected to the printed circuit board. As such, when a display device is tested to check its operation, etc. before shipment, a test may be performed while the flexible printed circuit film for touch is disconnected from the printed circuit board, for example, by connecting both the printed circuit board and the flexible printed circuit film for touch to a test device. However, this procedure may increase a test time and reduce test efficiency.

The above information disclosed in this Background section is only for enhancement of understanding of the background of the invention concepts, and, therefore it may contain information that does not constitute prior art.

SUMMARY

Devices constructed according to exemplary embodiments of the invention are capable of providing easy test environment and reduce occurrence of defects.

Additional features of the inventive concepts will be set forth in the description which follows, and in part will be apparent from the description, or may be learned by practice of the inventive concepts.

A display device according to an exemplary embodiment includes a display panel configured to display an image and sense a touch, a first flexible printed circuit film bonded to one edge of the display panel, a second flexible printed circuit film bonded to another edge of the display panel, and a printed circuit board to which the first flexible printed circuit film and the second flexible printed circuit film are bonded or connected, in which the second flexible printed circuit film includes a main portion and a tail portion extending from the main portion, and the tail portion includes a first portion extending from the main portion in a first direction and a second portion extending from the first portion in a second direction different from the first direction.

The main portion may include a body portion on which a touch driver is mounted, a pad portion bonded to the display panel, and a first bending portion disposed between the body portion and the pad portion, and the first portion of the tail portion may extend from the pad portion.

The printed circuit board and the body portion may be configured to be positioned on a rear surface of the display panel, and the first portion of the tail portion may be positioned on a front surface of the display panel.

The second portion of the tail portion may be positioned on the front surface of the display panel when the printed circuit board and the body portion are positioned on the rear surface of the display panel.

The tail portion may further include a third portion extending from the second portion in the first direction, the third portion comprising a second bending portion.

The third portion may include a first part configured to be positioned on the front surface of the display panel and a second part configured to be positioned on the rear surface of the display panel, when the printed circuit board and the body portion are positioned on the rear surface of the display panel.

The tail portion may further include a first connection portion at an end of the third portion, and the first connection portion may be connected to a second connection portion disposed on the printed circuit board.

The printed circuit board and the body portion are configured to be positioned on the rear surface of the display panel; and The first portion of the tail portion may include a bending portion, a first part configured to be positioned on the front surface of the display panel, and a second part configured to be positioned on the rear surface of the display panel, when the printed circuit board and the body portion are positioned on the rear surface of the display panel.

The second portion of the tail portion may be positioned on the rear surface of the display panel, when the printed circuit board and the body portion are positioned on the rear surface of the display panel.

The main portion may include a body portion on which a touch driver is mounted, a pad portion bonded to the display panel, and a first bending portion disposed between the body portion and the pad portion, and the first portion of the tail portion may extend from the body portion.

The printed circuit board, the body portion, and the first portion of the tail portion may be configured to be positioned on the rear surface of the display panel.

The first portion of the tail portion may include a second bending portion, a first part configured to be positioned on the front surface of the display panel, and a second part configured to be positioned on the rear surface of the display panel, when the printed circuit board and the body portion are positioned on the rear surface of the display panel.

The tail portion may further include a third portion extending from the second portion in the first direction, and the third portion of the tail portion may include a third bending portion, a first part of the third portion configured to be positioned on the front surface of the display panel, and a second part of the third portion configured to be positioned on the rear surface of the display panel, when the printed circuit board and the body portion are positioned on the rear surface of the display panel.

The display panel may include a first substrate and a second substrate disposed on the first substrate, and the first flexible printed circuit film for display may be bonded to a first pad portion disposed on the first substrate, and the second flexible printed circuit film is bonded to a second pad portion disposed on the second substrate.

A display device according to another exemplary embodiment includes a display panel including a first substrate and a second substrate disposed on the first substrate, a first flexible printed circuit film bonded onto the first substrate at one edge of the display panel, and a second flexible printed circuit film bonded onto the second substrate at another edge of the display panel, in which the second flexible printed circuit film includes a main portion and a tail portion, the main portion includes a pad portion bonded onto the first substrate, and the tail portion includes a first portion extending substantially in parallel to a length direction of the pad portion.

The tail portion may include at least one bending portion.

The main portion may further include a body portion on which a touch driver is mounted, and a bending portion disposed between the pad portion and the body portion, and the first portion of the tail portion may extend from the pad portion.

The body portion may be configured to be disposed on the rear surface of the display panel, and at least some of the first portion of the tail portion may be configured to be positioned on the front surface of the display panel.

The main portion may further include a body portion on which the touch driver is mounted, and a bending portion disposed between the pad portion and the body portion, and the first portion of the tail portion may extend from the body portion.

The display device may further include a printed circuit board to which the first flexible printed circuit film is bonded and to which the second flexible printed circuit film for touch is connected.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
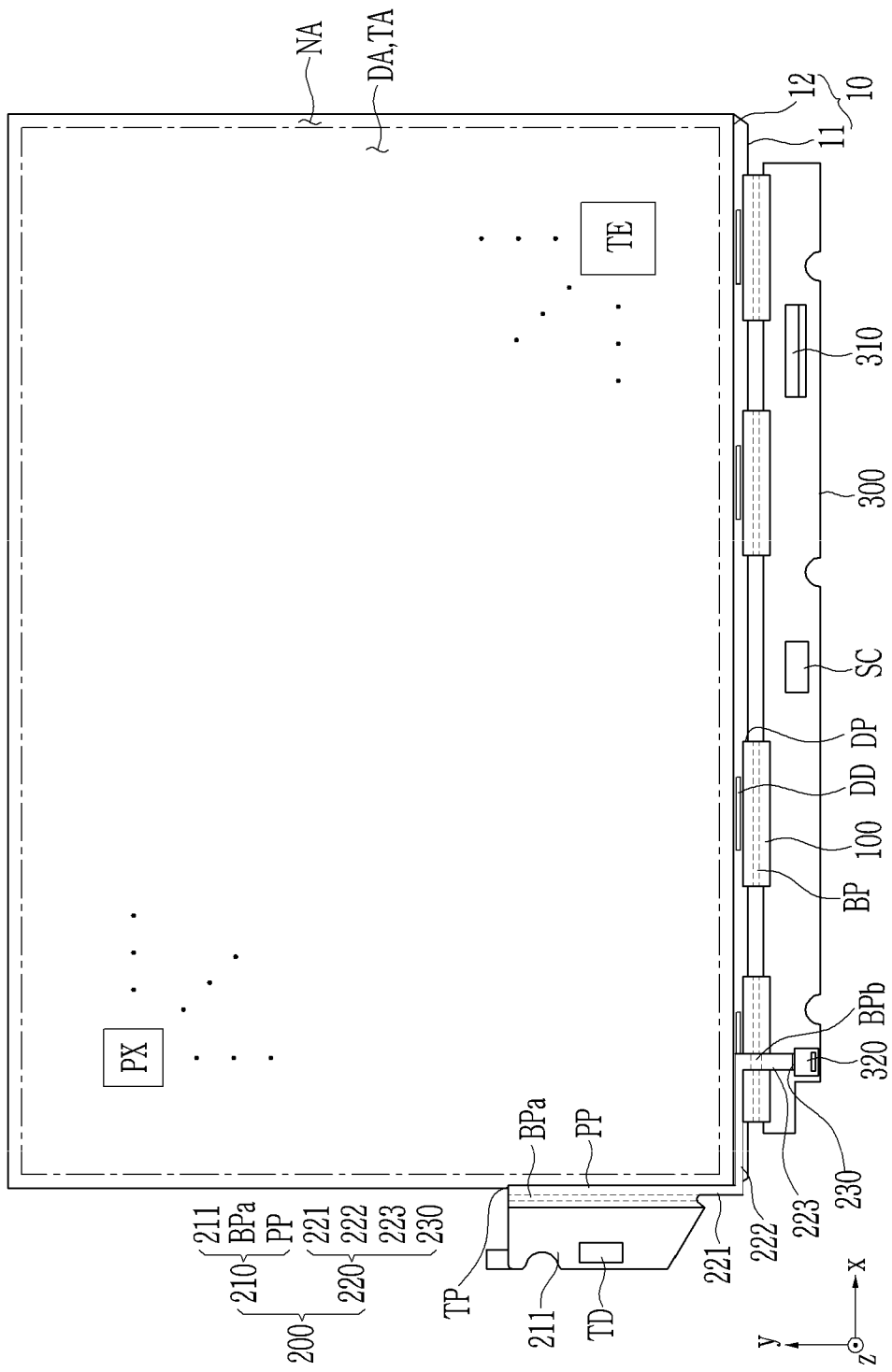
FIG. 1 is a front view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

A display device according to an exemplary embodiment will be described with reference to the accompanying drawings. Hereinafter, a display device will be described as an organic light emitting diode display, however, the inventive concepts are not limited thereto, and the display device may be applied to other display devices, such as a liquid crystal display.

Figure 2:
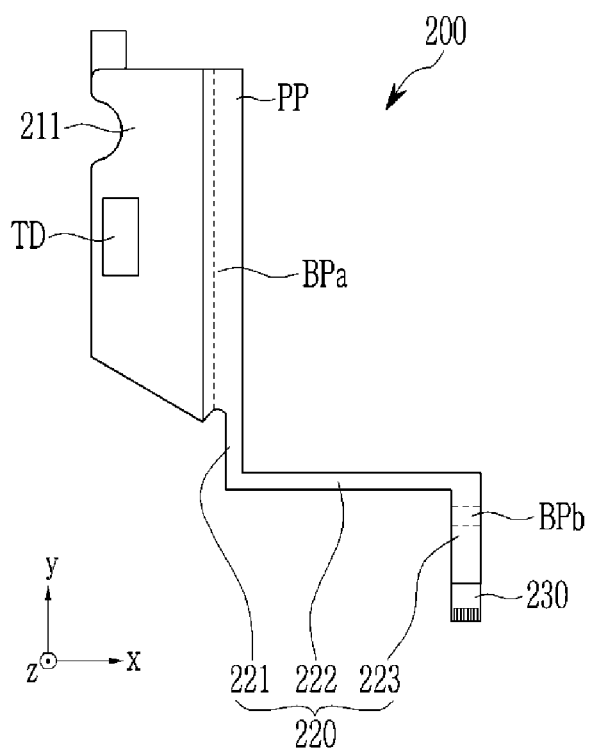
FIG. 2 is an enlarged view of a flexible printed circuit film for touch of the display device of FIG. 1.

FIG. 1 is a front view of a display device according to an exemplary embodiment. FIG. 2 is an enlarged view of a flexible printed circuit film 200 for touch of the display device of FIG. 1.

Referring to FIG. 1, a display device according to an exemplary embodiment includes a display panel 10, flexible printed circuit films 100 for display bonded to the display panel 10, a flexible printed circuit film 200 for touch, and a printed circuit board (PCB) 300. FIG. 1 illustrates a state in which the flexible printed circuit films 100 for display and the flexible printed circuit film 200 for touch are bonded or connected to the display panel 10 and the printed circuit board 300.

The display panel 10 may display an image and sense a touch. As used herein, "a flexible printed circuit film for display" may refer to a flexible printed circuit film for transmitting a signal to display an image on the display panel, and "a flexible printed circuit film for touch" may refer to a flexible printed circuit film for transmitting a signal for sensing a touch.

The display panel 10 is positioned inside a boundary line indicated by a single-dot chain line as shown in FIG. 1. The display panel 10 includes a display area DA corresponding to a screen for displaying an image, and a non-display area NA in which elements and/or wires for generating and/or transmitting various signals applied to the display area DA are formed. The size of a touch area TA capable of sensing a touch may be substantially the same as that of the display area DA. In the display area DA and the touch area TA, pixels PX and touch electrodes TE are arranged, for example, in a matrix form. The pixels PX may display an image, and the touch electrodes TE may sense a user's touch or non-touch. The display panel 10 may be referred to as a touch screen panel.

The display panel 10 includes a first substrate 11 and a second substrate 12. The first substrate 11 and the second substrate 12 may be bonded to each other by a sealant and the like. When the display device is an organic light emitting diode (OLED) display, the second substrate 12 may be an encapsulation substrate that may prevent moisture and/or oxygen from penetrating from the outside. A display active layer including the pixels PX and the wires connected to the pixels PX are disposed between the first substrate 11 and the second substrate 12. A touch sensing layer including the touch electrodes TE and wires connected to the touch electrodes TE are disposed on the second substrate 12. The touch sensing layer may be disposed between the first substrate 11 and the second substrate 12.

Pad portions DP (hereinafter referred to as "pad portions for display"), to which signals for operating and controlling the pixels PX are provided, are arranged on the first substrate 11 of the display panel 10. The flexible printed circuit film 100 for display is bonded to each pad portion DP for display. During bonding, an anisotropic conductive film (ACF) may be used for electrical connection and physical coupling between the flexible printed circuit films 100 for display and the pad portions DP for display. The anisotropic conductive film may be a film having an insulating layer, such as a resin, in which conductive particles are distributed. FIG. 1 shows four flexible printed circuit films 100 for display, however, the inventive concepts are not limited thereto, and the number of the flexible printed circuit films 100 for display may be varied.

A pad portion TP (hereinafter referred to as "a pad portion for touch"), to which signals for operating and controlling the touch electrodes TE are provided, is disposed on the second substrate 12 of the display panel 10. The flexible printed circuit film 200 for touch is bonded to the pad portion TP for touch.

Display drivers DD generating signals for driving the pixels PX are disposed on the first substrate 11. The display drivers DD may be provided as an integrated circuit chip, and may include data drivers. The display drivers DD may be disposed on the flexible printed circuit films 100 for display. On the first substrate 11, driving portions, such as a scan driver and a light emission driver, may be integrated in left and/or right non-display areas NA of the display area DA.

A touch driver TD for generating signals to drive the touch electrodes TE and processing signals received from the touch electrodes TE is disposed on the flexible printed circuit film 200 for touch. The touch driver TD may be provided as an integrated circuit chip.

Three edges (an upper side, a left side, and a right side in an x-y plane) of the first substrate 11 may substantially coincide with three edges of the second substrate 12 in a plan view, but the first substrate 11 may be formed to be greater than the second substrate 12 in an area (e.g. lower edge area), on which the pad portions DP for display are disposed for bonding the flexible printed circuit films 100 for display.

The flexible printed circuit films 100 for display is bonded to the first substrate 11 at a lower edge portion of the display panel 10, and the flexible printed circuit film 200 for touch is bonded to the second substrate 12 at a lateral edge portion of the display panel 10. In this case, as compared with a case where the flexible printed circuit film 200 for touch is bonded to the lower edge portion of the display panel 10, to which the flexible printed circuit film 100 for display is also bonded, a bezel width (which corresponds to a front width of an electronic device surrounding a screen) of a lower portion of an electronic device, such as a tablet including a display device, may be reduced.

In FIG. 1, the flexible printed circuit film 200 for touch is bonded to a left edge portion of the display panel 10. However, the flexible printed circuit film 200 for touch may be bonded to a right edge portion of the display panel 10. In this case, the flexible printed circuit film 200 for touch may have a substantially symmetrical structure with respect to a central axis of a y-direction of the display panel 10 shown in FIG. 1. The printed circuit board 300 may be disposed at a long side of the display panel 10 and the flexible printed circuit film 200 for touch may be positioned at a short side of the display panel 10 as shown in FIG. 1, or vice versa.

The flexible printed circuit film 100 for display includes a bending portion BP. The bending portion BP is a portion that may be mainly bent, when the printed circuit board 300 is bent to be positioned on a rear surface (i.e., an opposite surface of a screen) of the display panel 10.

A signal controller SC generating signals to control the display drivers DD is disposed on the printed circuit board 300. The signal controller SC may generate signals for controlling the touch driver TD. The signal controller SC may include a timing controller. The printed circuit board 300 is provided with an input portion 310 for receiving signals and powers from the outside. The pad portions are positioned on the printed circuit board 300, and the flexible printed circuit films 100 for display are bonded to the pad portions. The printed circuit board 300 includes a connection portion 320, to which the flexible printed circuit film 200 for touch may be connected.

The flexible printed circuit film 200 for touch will now be described in detail with reference to FIG. 2 together with FIG. 1. The flexible printed circuit film 200 for touch includes a main portion 210 having a larger width and a tail portion 220 having a relatively narrower width. The touch driver TD is disposed on the main portion 210, and the tail portion 220 is connected to the printed circuit board 300. The main portion 210 includes a body portion 211, a pad portion PP, and a bending portion BPa. The body portion 211 is a portion on which the touch driver TD is mounted, the pad portion PP is a portion bonded to the pad portion TP for touch of the second substrate 12, and the bending portion BPa is a portion that is mainly bent when the body portion 211 is bent to be positioned on a rear surface of the display panel 10.

The tail portion 220 may extend from the pad portion PP of the main portion 210. The tail portion 220 may have a structure that is bent twice in an unfolded state, as shown in FIG. 2. More particularly, the tail portion 220 includes a first portion 221 extending in a downward direction from the pad portion PP, a second portion 222 extending in a rightward direction from the first portion 221, and a third portion 223 extending in a downward direction from the second portion 222. When the flexible printed circuit film 200 for touch is disposed at the right side of the display panel 10, the second portion 222 may extend in a leftward direction from the first portion 221.

The first portion 221 and the third portion 223 may extend in a substantially parallel direction (y-direction or first direction) to a length direction of the pad portion PP, and the second portion 222 may extend in a substantially perpendicular direction (x-direction or second direction) to the length direction of the pad portion PP. At least some of the first portion 221 may overlap the non-display area NA of the display panel 10. Most or all of the second portion 222 may overlap the non-display area NA of the display panel 10. The third portion 223 includes a portion at which the display panel 10 overlaps the non-display area NA, a portion at which the display panel 10 overlaps the printed circuit board 300, and a bending portion BPb disposed therebetween. All portions of the tail portion 220 may be bent, but the bending portion BPb may be a portion that is mainly bent when the printed circuit board 300 is bent to be positioned on a rear surface of the display panel 10. The bending portion BPb may overlap the bending portion BP of the flexible printed circuit film 100 for display.

In the flexible printed circuit film 200 for touch, the body portion 211 of the main portion 210 may be thicker than other portions. For example, the body portion 211 may be formed of three or more layers, and the bending portion BPa, the pad portion PP, and the tail portion 220 may be formed of two or less layers.

The tail portion 220 includes a connection portion 230 at one end of the third portion 223. The connection portion 230 is a portion connected to the connection portion 320 of the printed circuit board 300. The connection portion 230 and the connection portion 320 may form a board-to-board (BTB) connector. Alternatively, the connection portion 230 and the connection portion 320 may form a zero insertion force (ZIF) connector. For example, the connection portion 320 may be a ZIF socket, and the connection portion 230 may be a portion inserted into the ZIF socket. In addition, various connection methods generally known in the art for electrically and physically connecting the connection portion 230 and the connection portion 320 may be used.

As shown in FIG. 1, the flexible printed circuit films 100 for display is bonded to the display panel 10 and to the printed circuit board 300, and the flexible printed circuit film 200 for touch is bonded to the display panel 10 and is connected to the printed circuit board 300. Accordingly, while the display device is tested, a test device may be connected to only the input portion 310 of the printed circuit board 300 for the test. If a test process is performed while the flexible printed circuit film 200 for touch is not connected to the printed circuit board 300, it would be necessary to connect the test device to the connection portion 230 of the flexible printed circuit film 200 for touch, as well as to the input portion 310 of the printed circuit board 300. According to an exemplary embodiment, when the test device is connected to only one portion (e.g., the input portion 310) of the display device, a test time may be shortened and a test process may be easily automated.

Figure 3:
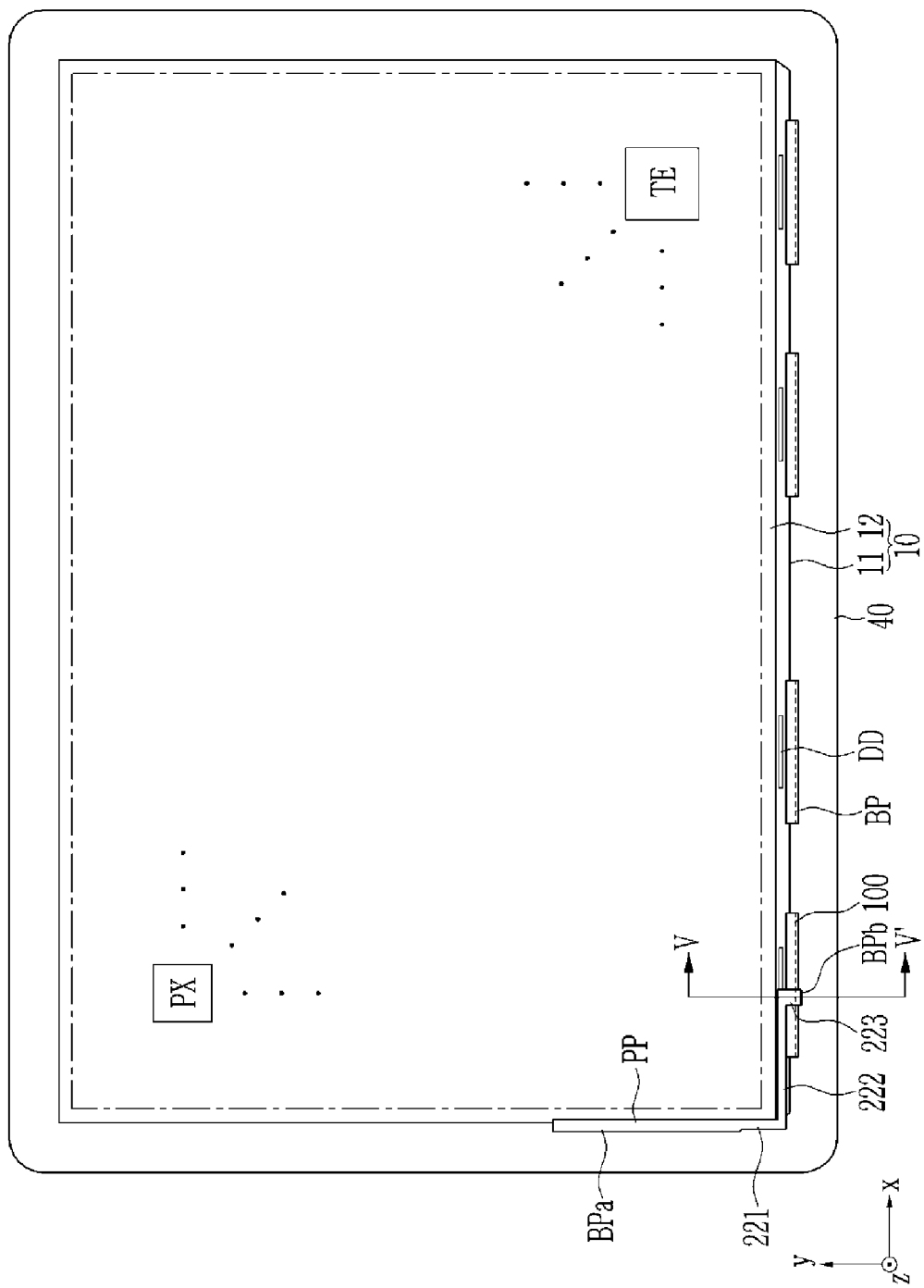
FIG. 3 and FIG. 4 are a front view and a rear view of the display device of FIG. 1, respectively, according to an exemplary embodiment.
Figure 4:
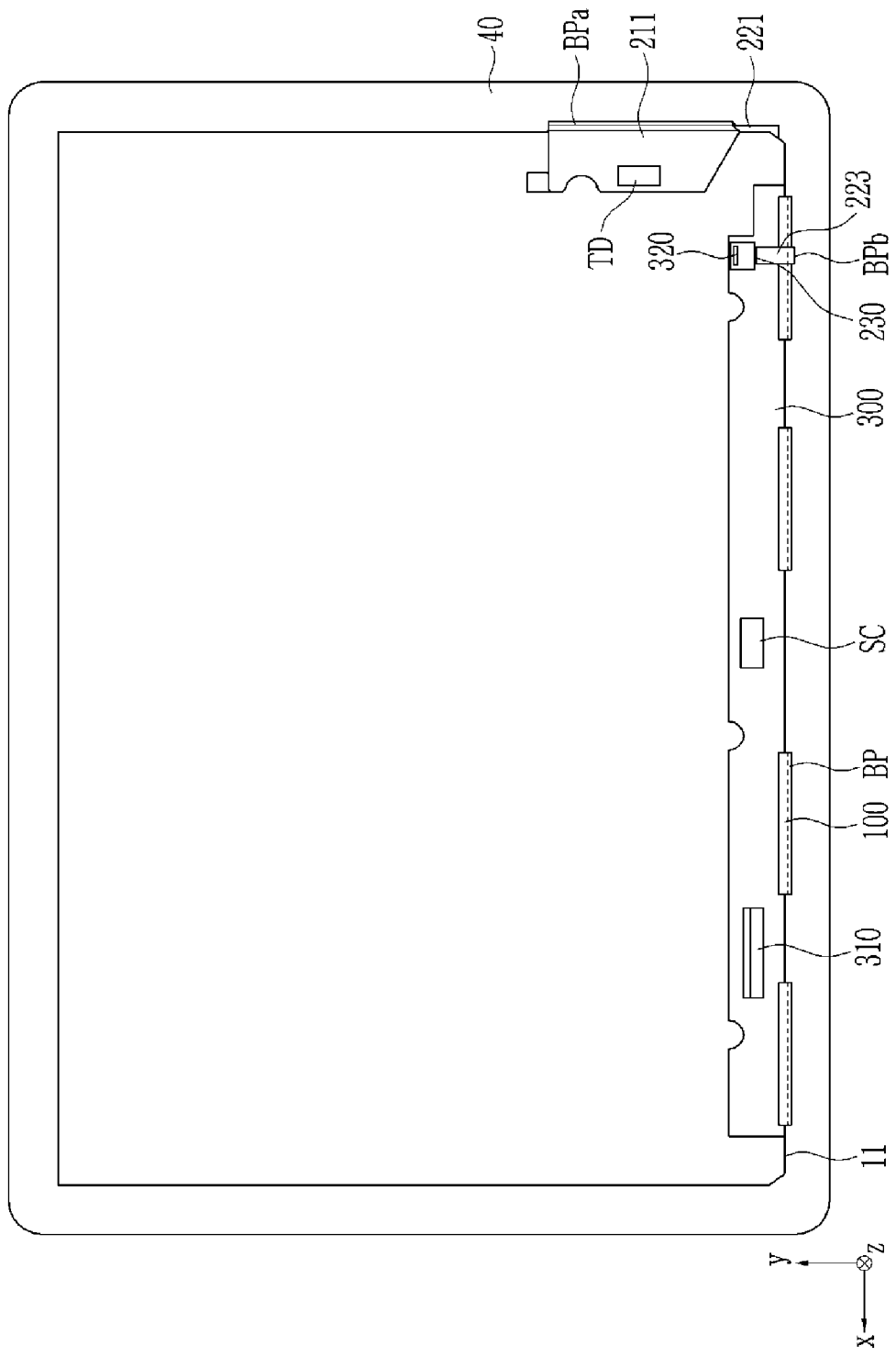
Figure 5:
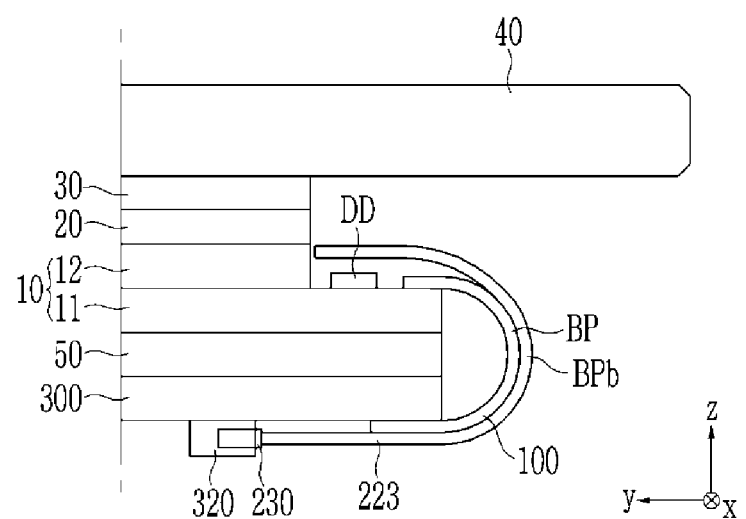
FIG. 5 is a cross-sectional view taken along line V-V of FIG. 3.

FIG. 3 and FIG. 4 show a front view and a rear view of a display device, respectively, when a body portion 211 of a flexible printed circuit film 200 for touch and a printed circuit board 300 of FIG. 1 are positioned on a rear surface of a display panel 10. FIG. 5 is a cross-sectional view taken along line V-V of FIG. 3. Although the display device shown in FIG. 3 to FIG. 5 is substantially the same as that shown in FIG. 1, the display device shown in FIG. 3 to FIG. 5 includes a window 40.

In the display device included in an electronic device, the bending portions BP of the flexible printed circuit films 100 for display and the bending portions BPa and BPb of the flexible printed circuit film 200 for touch are bent, such that the printed circuit board 300 and the body portion 211 may be bent to be positioned on a rear surface of the display panel 10, as shown in FIG. 3 to FIG. 5. In particular, the bending portions BP of the flexible printed circuit films 100 for display and the bending portion BPb of the tail portion 220 of the flexible printed circuit film 200 for touch are bent at a lower portion of the display panel 10. The bending portion BPa of the main portion 210 of the flexible printed circuit film 200 for touch is bent at a lateral portion of the display panel 10.

Such bending may be simply performed by bending the printed circuit board 300 backward to the rear surface of the display panel 10, and bending the body portion 211 of the flexible printed circuit film 200 for touch backward to the rear surface of the display panel 10, while the connection portion 230 of the flexible printed circuit film 200 for touch is connected to the connection portion 320 of the printed circuit board 300. In order to fix positions of the printed circuit board 300 and the flexible printed circuit film 200 for touch, the printed circuit board 300 and the flexible printed circuit film 200 for touch may be attached to the rear surface of the display panel 10. As such, by positioning the printed circuit board 300 and the body portion 211 of the flexible printed circuit film 200 for touch on the rear surface of the display panel 10, portions protruding from the display panel 10 may be minimized (or substantially reduced). Therefore, a width of a bezel of an electronic device (e.g., a tablet) including the display device may be reduced, in addition to improving spatial utility of the electronic device.

When the bending portions BPa and BPb of the flexible printed circuit film 200 for touch are bent, the pad portion PP, the entire first and second portions 221 and 222 of the tail portion 220, and some (e.g., an upper portion of the bending portion BPb) of the third portion 223 of the tail portion 220 may be positioned on a front surface of the display panel 10. The body portion 211, the connection portion 230, and some (a portion between the bending portion BPb and the tail portion 220) of the third portion 223 of the tail portion 220 may be positioned on the rear surface of the display panel 10. Since the tail portion 220 hardly protrudes from the display panel 10 (for example, since the first portion 221 protrudes to a degree similar to the pad portion PP, the second portion 222 is in an area of the display panel 10, and the third portion 223 protrudes to a degree similar to the flexible printed circuit film 100 for display) as shown in FIG. 3, a dead space due to the tail portion 220 does not increase or hardly increases.

Due to the structure of the tail portion 220 of the flexible printed circuit film 200 for touch, the connection portion 230 of the flexible printed circuit film 200 for touch may not need to be separated from the connection portion 320 of the printed circuit board 300 to position the printed circuit board 300 and the body portion 211 on the rear surface of the display panel 10. Accordingly, it is not necessary to separate the flexible printed circuit film 200 for touch from the printed circuit board 300 after performing the test, since the test is conducted while the flexible printed circuit film 200 for touch is connected to the printed circuit board 300.

In addition, even a process of attaching or replacing a digitizer, a cushion sheet, an insulating sheet, or the like to the rear surface of the display panel 10 may be easily performed, by unfolding the bending portions BP of the flexible printed circuit films 100 for display and the bending portions BPa and BPb of the flexible printed circuit film 200 for touch as illustrated in FIG. 1, in which the connection portion 230 of the flexible printed circuit film 200 for touch is connected to the connection portion 320 of the printed circuit board 300. Even if the connection portion 230 and the connection portion 320 are connectors that may be disconnected or reconnected, when the connection portions 230 and 320 are disconnected or reconnected, wires and terminals thereof may be damaged, which may cause defects. Therefore, maintaining an original connection state of the connection portions 230 and 320 may enhance work or product reliability.

FIG. 5 is a schematic cross-sectional structure of the display device according to an exemplary embodiment. The display device according to the illustrated exemplary embodiment includes substantially the same elements as those of the display device of FIGS. 1 to 3, and thus, detailed descriptions of the substantially the same elements will be omitted to avoid redundancy. The display device of FIG. 5 according to the illustrated embodiment further includes a polarization layer 20 disposed on the second substrate 12 of the display panel 10. In an organic light emitting diode display, the polarization layer 20 may reduce external light reflection. The window 40 may be disposed on the polarization layer 20, and an adhesive layer 30 for bonding the polarization layer 20 and the window 40 may be disposed between the polarization layer 20 and the window 40. The window 40 may protect the display panel 10, the polarization layer 20, and the like from being damaged by an external impact or the like. The window 40 may be formed of a transparent and rigid material, such as glass or plastic. At least one functional sheet 50 for buffering, heat dissipation, light-blocking, insulation, etc. may be disposed under the first substrate 11 of the display panel 10. The bending portion BP of the flexible printed circuit film 100 for display and the bending portion BPb of the tail portion 220 of the flexible printed circuit film 200 for touch may be bent, so that the printed circuit board 300 and the connection portion 230 of the flexible printed circuit film 200 for touch connected thereto may be positioned on the rear surface of the display panel 10.

Hereinafter, a structure of a tail portion 220 of a flexible printed circuit film 200 for touch according to exemplary embodiments will be described with a focus on differences from that of the tail portion 220 of the flexible printed circuit film 200 described above with reference to FIGS. 1 to 2.

Figure 6:
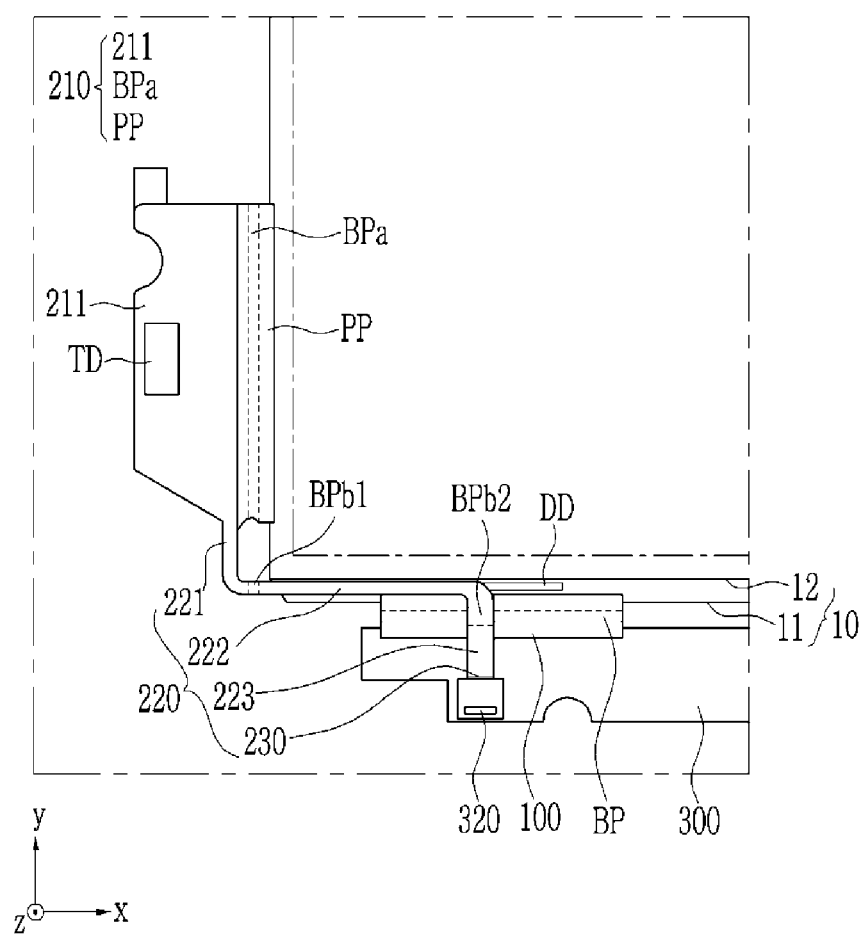
FIG. 6 is a front view of a display device according to an exemplary embodiment.
Figure 7:
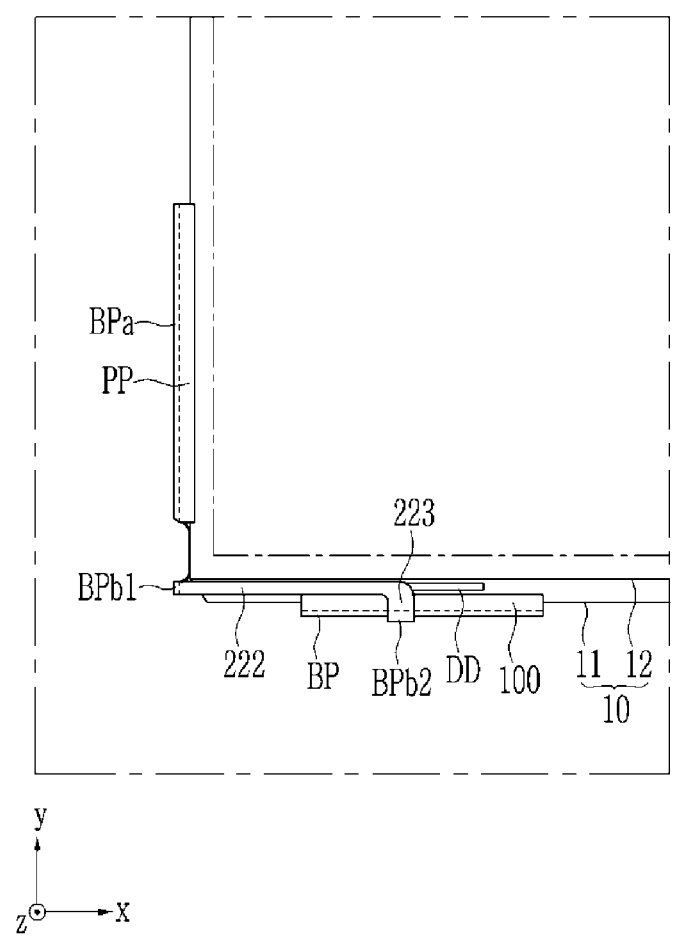
FIG. 7 and FIG. 8 are a front view and a rear view of the display device of FIG. 6, respectively, according to an exemplary embodiment.
Figure 8:
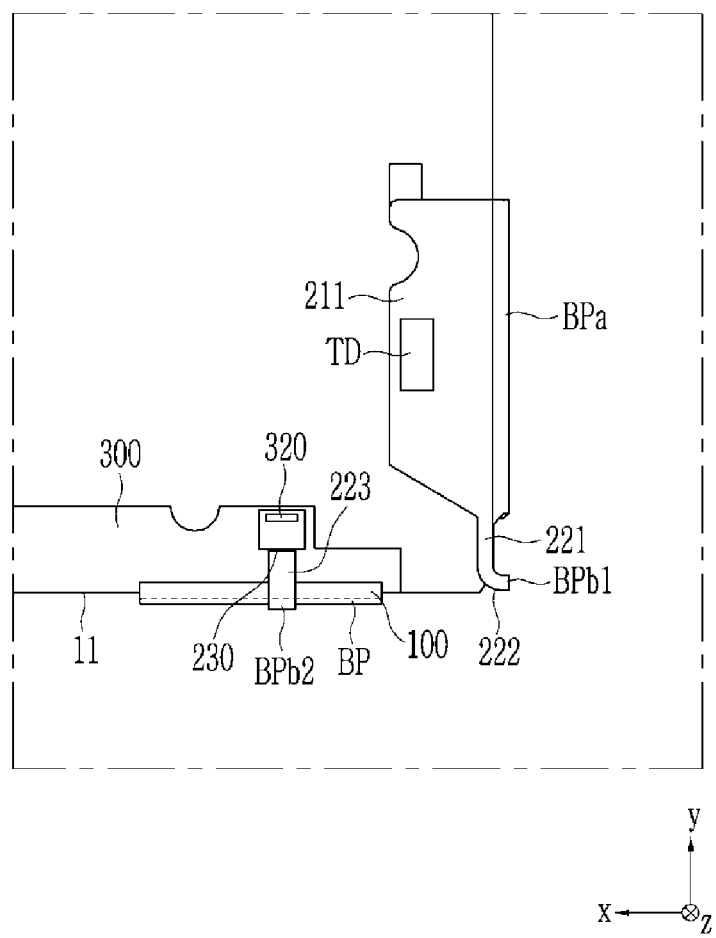

FIG. 6 illustrates a front view of a display device according to an exemplary embodiment. FIG. 7 and FIG. 8 are a front view and a rear view of a display device, respectively, when a body portion 211 of a flexible printed circuit film 200 for touch and a printed circuit board 300 of FIG. 6 are positioned on a rear surface of a display panel 10. FIG. 6 to FIG. 8 illustrate a portion (a portion corresponding to the lower left portion of FIG. 1) of the display device.

Referring to FIG. 6, the flexible printed circuit film 200 for touch includes the main portion 210 and the tail portion 220. The main portion 210 includes the body portion 211 on which the touch driver TD is mounted, the pad portion PP bonded to the display panel 10, and the bending portion BPa between the body portion 211 and the pad portion PP. The tail portion 220 extends from the body portion 211, rather than the pad portion PP of the main portion 210. More particularly, the tail portion 220 includes the first portion 221 extending in a downward direction from the body portion 211, the second portion 222 extending in a rightward direction from the first portion 221, the third portion 223 extending in a downward direction from the second portion 222, and the connection portion 230. Thus, the first portion 221 is positioned farther away from the display panel 10 than the bending portion BPa. The third portion 223 includes a bending portion BPb2, and the second portion 222 includes a bending portion BPb1. The bending portion BPb1 may be mainly bent when the flexible printed circuit film 200 for touch is bent to be positioned on the rear surface of the display panel 10, and the bending portion BPb2 may be mainly bent when the printed circuit board 300 is bent to be positioned on the rear surface of the display panel 10.

Referring to FIG. 7 and FIG. 8, the bending portion BP of the flexible printed circuit film 100 for display and the bending portions BPa, BPb1, and BPb2 of the flexible printed circuit film 200 for touch are bent, so that the printed circuit board 300 and the body portion 211 are positioned on the rear surface of the display panel 10. The first portion 221 of the tail portion 220 of the flexible printed circuit film 200 for touch may be positioned on the rear surface of the display panel 10 together with the body portion 211. Most portions of the second portion 222 of the tail portion 220 are positioned on the front surface of the display panel 10, and a small portion thereof is positioned on the rear surface of the display panel 10. Some of the third portion 223 of the tail portion 220 is positioned on the front surface of the display panel 10, and some other thereof is positioned on the rear surface of the display panel 10.

Similar to the above-described exemplary embodiments, the flexible printed circuit film 200 for touch may be unfolded as shown in FIG. 6 or may be bent as shown in FIG. 7 and FIG. 8, while the connection portion 230 is connected to the connection portion 320 of the printed circuit board 300, together with the flexible printed circuit film 100 for display. Since the tail portion 220 hardly protrudes from the display panel 10 (for example, since the second portion 222 protrudes to a degree similar to the bending portion BPa), the dead space due to the tail portion 220 does not increase or hardly increases.

Figure 9:
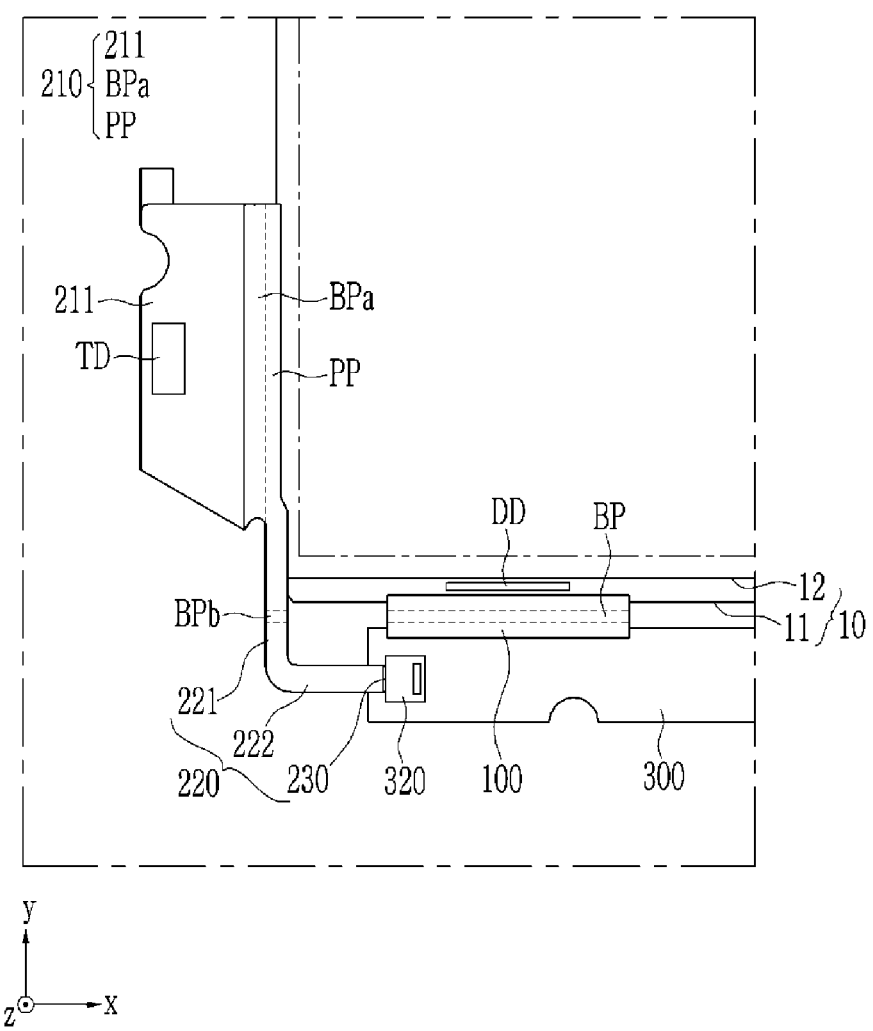
FIG. 9 is a front view of a display device according to an exemplary embodiment.
Figure 10:
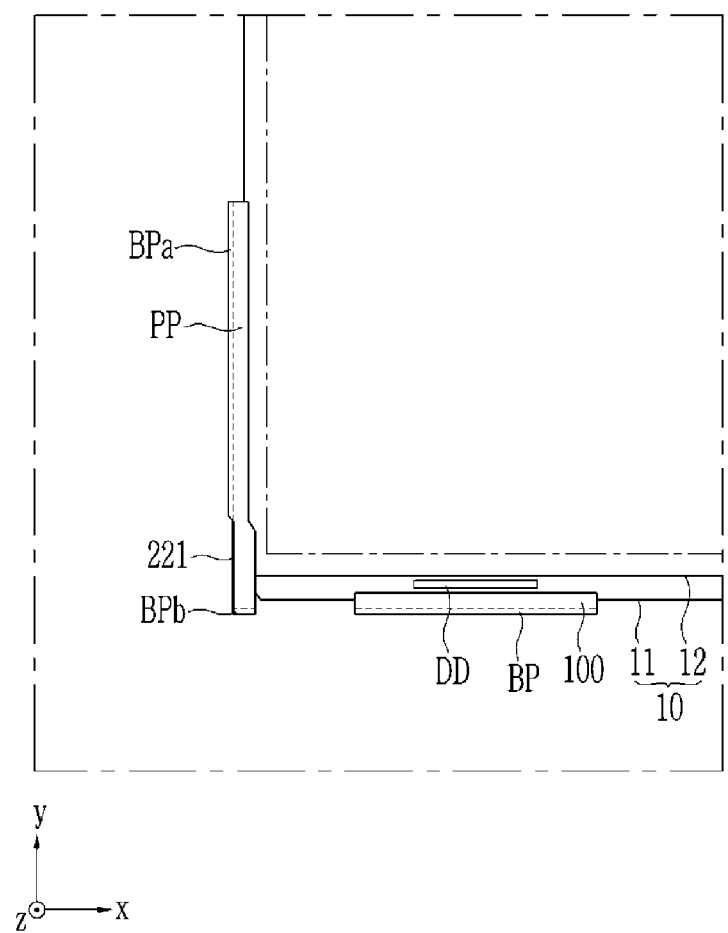
FIG. 10 and FIG. 11 are a front view and a rear view of the display device of FIG. 9, respectively, according to an exemplary embodiment.
Figure 11:
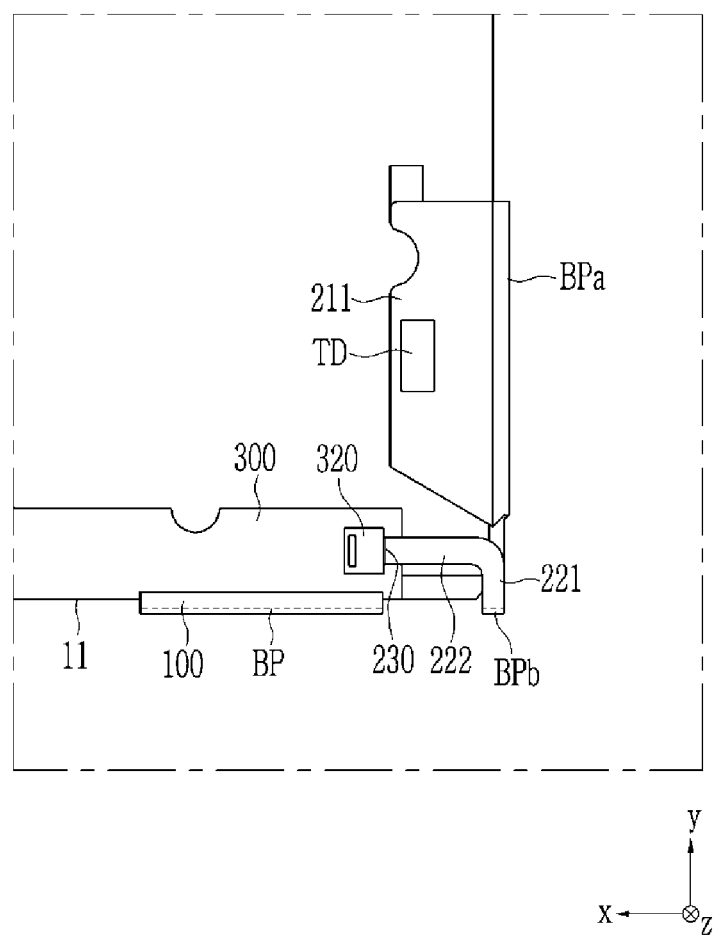

FIG. 9 is a front view of a display device according to an exemplary embodiment. FIG. 10 and FIG. 11 are a front view and a rear view of a display device, respectively, when a the body portion 211 of a flexible printed circuit film 200 for touch and a printed circuit board 300 of FIG. 9 are positioned on a rear surface of a display panel 10. Similarly to FIG. 6 to FIG. 8, FIG. 9 to FIG. 11 illustrate a portion of the display device.

Referring to FIG. 9, the flexible printed circuit film 200 for touch includes the main portion 210 and the tail portion 220. The tail portion 220 may extend from the pad portion PP of the main portion 210, and may have a single-bent structure in a plan view. Specifically, the tail portion 220 includes the first portion 221 extending in a downward direction from the pad portion PP, the second portion 222 extending in a rightward direction from the first portion 221, and the connection portion 230. The first portion 221 extends substantially in a downward direction past a lower edge of the display panel 10 to the printed circuit board 300, so that the first portion 221 may include the bending portion BPb that may be bent together with the bending portion BP of the flexible printed circuit film 100 for display. The bending portion BPb may be mainly bent when the printed circuit board 300 is bent to be positioned on the rear surface of the display panel 10.

Referring to FIG. 8 and FIG. 9, the bending portion BP of the flexible printed circuit film 100 for display and the bending portions BPa and BPb of the flexible printed circuit film 200 for touch may be bent, so that the printed circuit board 300 and the body portion 211 are positioned on the rear surface of the display panel 10. Some of the first portion 221 of the tail portion 220 of the flexible printed circuit film 200 for touch is positioned on the front surface of the display panel 10, and some other portion thereof is positioned on the rear surface of the display panel 10. The second portion 222 of the tail portion 220 is positioned on the rear surface of the display panel 10.

The flexible printed circuit film 200 for touch may be unfolded as shown in FIG. 9, or may be bent as shown in FIG. 10 and FIG. 11, while the connection portion 230 is connected to the connection portion 320 of the printed circuit board 300, together with the flexible printed circuit film 100 for display. Since the tail portion 220 hardly protrudes from the display panel 10 (for example, since the first portion 221 protrudes to a degree similar to the pad portion PP and the bending portion BP), the dead space due to the tail portion 220 does not increase or hardly increases.

In addition to the above-described exemplary embodiments, the tail portion 220 of the flexible printed circuit film 200 for touch may be variously changed. For example, the first portion 221 shown in FIG. 9 may extend in a downward direction from the body portion 211 as shown in FIG. 6. In this case, since the first portion 221 may be positioned farther away from the display panel 10 than the bending portion BPa, the second portion 222 of the tail portion 220 may also include a bending portion to be bent together with the bending portion BPa. In addition, the tail portion 220 may be variously changed in an area overlapping the printed circuit board 300. For example, the tail portion 220 may be further bent according to a connection direction of the connection portion 320.

Hereinafter, a cross-sectional structure of a display device according to an exemplary embodiment will be described in further detail with reference to FIG. 12.

Figure 12:
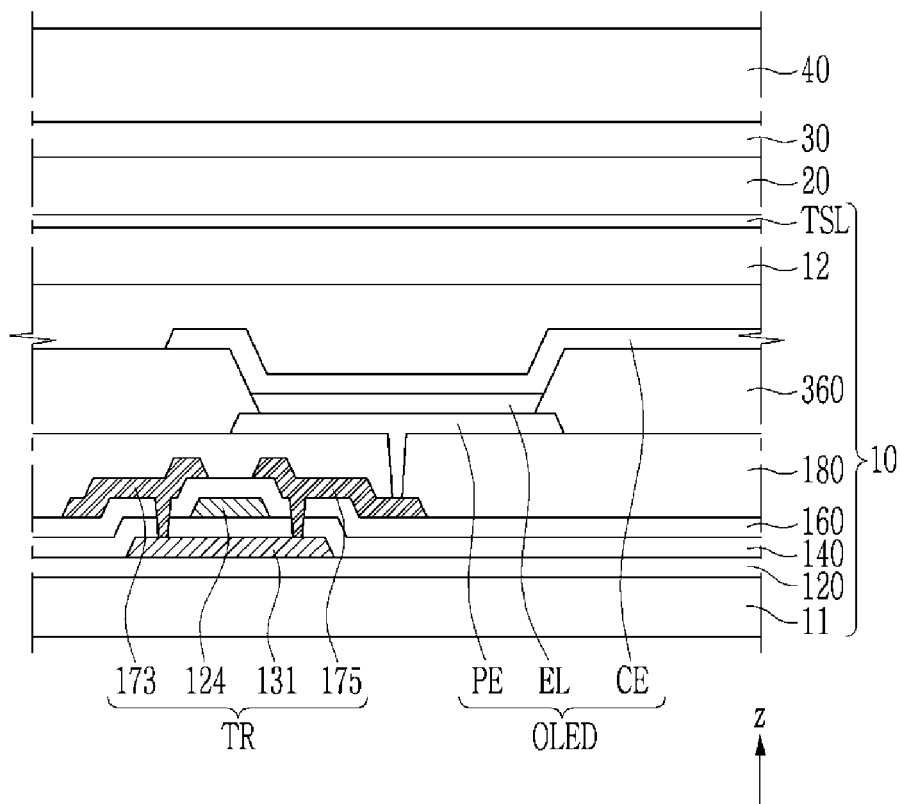
FIG. 12 is a cross-sectional view of a display device according to an exemplary embodiment.

FIG. 12 is a cross-sectional view of a stacked structure of a display panel 10 in a display device according to an exemplary embodiment. The cross-section shown in FIG. 12 substantially corresponds to one pixel area. The display device includes the display panel 10, and the polarization layer 20, the adhesive layer 30, and the window 40 that are stacked on the display panel 10. The display panel 10 includes the first substrate 11, a transistor TR formed on the first substrate 11, and an organic light emitting diode OLED connected to the transistor TR, and the second substrate 12 as an encapsulation substrate. The transistor TR and the organic light emitting diode OLED may form the pixel PX and the display active layer described in FIG. 1.

The first substrate 11 may be a rigid substrate made of glass or the like. The first substrate 11 may be a flexible substrate including a polymer, such as polyimide, polyamide, polyethylene terephthalate, or the like.

A buffer layer 120 is disposed on the first substrate 11. The buffer layer 120 may block impurities diffusing from the first substrate 11 into a semiconductor layer 131 in a process of forming the semiconductor layer 131, and reduce stress applied to the first substrate 11.

The semiconductor layer 131 of the transistor TR is disposed on the buffer layer 120, and a gate insulating layer 140 is disposed on the semiconductor layer 131. The semiconductor layer 131 includes a source region, a drain region, and a channel region between the source region and the drain region. The semiconductor layer 131 may include polysilicon, an oxide semiconductor, or amorphous silicon. The gate insulating layer 140 may include an inorganic insulating material, such as a silicon oxide, a silicon nitride, or the like.

A gate conductor including a gate electrode 124 of the transistor TR is disposed on the gate insulating layer 140. The gate conductor may include metal such as, for example, molybdenum (Mo), copper (Cu), aluminum (Al), silver (Ag), chromium (Cr), tantalum (Ta), and titanium (Ti), or a metal alloy thereof.

An interlayer insulating layer 160 is disposed on the gate conductor. The interlayer insulating layer 160 may include an inorganic insulating material and/or an organic insulating material.

A data conductor including a source electrode 173 and a drain electrode 175 of the transistor TR is disposed on the interlayer insulating layer 160. The source electrode 173 and the drain electrode 175 are respectively connected to the source region and the drain electrode of the semiconductor layer 131 through contact holes formed in the interlayer insulating layer 160 and the gate insulating layer 140. The data conductor may include metal such as, for example, aluminum (Al), copper (Cu), silver (Ag), molybdenum (Mo), chromium (Cr), gold (Au), platinum (Pt), palladium (Pd), tantalum (Ta), Tungsten (W), titanium (Ti), nickel (Ni), and the like, or a metal alloy thereof.

A passivation layer 180 is disposed on the data conductor. The passivation layer 180 may include an organic insulating material. A pixel electrode PE is disposed on the passivation layer 180. The pixel electrode PE may be connected to the drain electrode 175 through a contact hole formed in the passivation layer 180 to receive a data signal for controlling luminance of the organic light emitting diode OLED.

A pixel defining layer 360 is disposed on the passivation layer 180. The pixel defining layer 360 is provided with an opening overlapping the pixel electrode PE. An emission layer EL is disposed on the pixel electrode PE in the opening of the pixel defining layer 360, and a common electrode CE is disposed on the emission layer EL. The pixel electrode PE, the emission layer EL, and the common electrode CE form the organic light emitting diode OLED. The pixel electrode PE may be an anode of the organic light emitting diode OLED, and the common electrode CE may be a cathode of the organic light emitting diode OLED. The common electrode CE may include a transparent conductive material, such as an indium tin oxide (ITO) and an indium zinc oxide (IZO).

The second substrate 12 for protecting the organic light emitting diode OLED is disposed on the common electrode CE. According to an exemplary embodiment, a thin film encapsulation layer may be disposed on the common electrode CE rather than the second substrate 12.

A touch sensor layer TSL is disposed on the second substrate 12. The touch sensor layer TSL may include touch electrodes formed with a transparent conductive material, such as ITO and IZO, a metal mesh, and the like, and the touch electrodes may be formed as a single layer or a multi-layer.

The polarization layer 20 for reducing external light reflection is disposed on the touch sensor layer TSL, and the adhesive layer 30 for attaching the window 40 is disposed on the polarization layer 20. A protective film and/or a functional sheet for protecting the display panel 10 may be disposed below the first substrate 11.

Although the display device is being described as the organic light emitting diode display, however, the inventive concepts are not limited thereto, and the display device may be a liquid crystal display including, for example, a liquid crystal layer.

According to the exemplary embodiments, after testing a display device in a state of connecting a flexible printed circuit film for touch to a printed circuit board, it is unnecessary to separate the flexible printed circuit film for touch from the printed circuit board in order to place the flexible printed circuit film for touch and the printed circuit board on a rear surface of a display panel. Therefore, it is possible to easily test the display device and to prevent defects that may occur when the flexible printed circuit film for touch is separated.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel configured to display an image and sense a touch, the display panel having a first side surface and a second side surface extending in directions that cross each other;
   a first flexible printed circuit film bonded to the display panel along the first side surface of the display panel;
   a second flexible printed circuit film bonded to the display panel and extending along the first and second side surfaces of the display panel; and
   a printed circuit board to which the first flexible printed circuit film and the second flexible printed circuit film are bonded or connected,
   wherein:
   the second flexible printed circuit film comprises a main portion and a tail portion extending from the main portion;
   the main portion comprises a body portion on which a touch driver is mounted, a pad portion bonded to the display panel, and a first bending portion disposed between the body portion and the pad portion;
   the tail portion comprises a first portion extending from at least one of the body portion and the pad portion of the main portion in a first direction and a second portion extending from the first portion in a second direction different from the first direction.

2. The display device of claim 1, wherein:
   the printed circuit board and the body portion are configured to be positioned on a rear surface of the display panel; and
   the first portion of the tail portion is positioned on a front surface of the display panel.

3. The display device of claim 2, wherein the second portion of the tail portion is positioned on the front surface of the display panel when the printed circuit board and the body portion are positioned on the rear surface of the display panel.

4. The display device of claim 2, wherein the tail portion further comprises a third portion extending from the second portion in the first direction, the third portion comprising a second bending portion.

5. The display device of claim 4, wherein the third portion comprises a first part configured to be positioned on the front surface of the display panel and a second part configured to be positioned on the rear surface of the display panel, when the printed circuit board and the body portion are positioned on the rear surface of the display panel.

6. The display device of claim 4, wherein:
the tail portion further comprises a first connection portion at an end of the third portion; and
the first connection portion is connected to a second connection portion disposed on the printed circuit board.

7. The display device of claim 1, wherein:
the printed circuit board and the body portion are configured to be positioned on the rear surface of the display panel; and
the first portion of the tail portion comprises a bending portion, a first part configured to be positioned on the front surface of the display panel, and a second part configured to be positioned on the rear surface of the display panel, when the printed circuit board and the body portion are positioned on the rear surface of the display panel.

8. The display device of claim 7, wherein the second portion of the tail portion is positioned on the rear surface of the display panel, when the printed circuit board and the body portion are positioned on the rear surface of the display panel.

9. The display device of claim 1, wherein the printed circuit board, the body portion, and the first portion of the tail portion are configured to be positioned on the rear surface of the display panel.

10. The display device of claim 9, wherein the first portion of the tail portion comprises a second bending portion, a first part configured to be positioned on the front surface of the display panel, and a second part configured to be positioned on the rear surface of the display panel, when the printed circuit board and the body portion are positioned on the rear surface of the display panel.

11. The display device of claim 10, wherein:
the tail portion further comprises a third portion extending from the second portion in the first direction; and
the third portion of the tail portion comprises a third bending portion, a first part of the third portion configured to be positioned on the front surface of the display panel, and a second part of the third portion configured to be positioned on the rear surface of the display panel, when the printed circuit board and the body portion are positioned on the rear surface of the display panel.

12. The display device of claim 1, wherein:
the display panel comprises a first substrate and a second substrate disposed on the first substrate; and
the first flexible printed circuit film for display is bonded to a first pad portion disposed on the first substrate, and the second flexible printed circuit film is bonded to a second pad portion disposed on the second substrate.

13. A display device comprising:
a display panel comprising a first substrate and a second substrate disposed on the first substrate, the display panel having a first side surface and a second side surface extending in directions that cross each other;
a first flexible printed circuit film bonded onto the first substrate along the first side surface of the display panel; and
a second flexible printed circuit film bonded onto the second substrate and extending along the first and second side surfaces of the display panel,
wherein:
the second flexible printed circuit film comprises a main portion and a tail portion;
the main portion comprises a pad portion bonded onto the first substrate, a body portion on which a touch driver is mounted, and a bending portion disposed between the pad portion and the body portion; and
the tail portion comprises a first portion extending from at least one of the body portion and the pad portion of the main portion and substantially in parallel to a length direction of the pad portion.

14. The display device of claim 13, wherein the tail portion comprises at least one bending portion.

15. The display device of claim 13, wherein:
the body portion is configured to be disposed on the rear surface of the display panel; and
at least some of the first portion of the tail portion is configured to be positioned on the front surface of the display panel.

16. The display device of claim 13, further comprising a printed circuit board to which the first flexible printed circuit film is bonded and to which the second flexible printed circuit film for touch is connected.

* * * * *